United States Patent
Fruehling et al.

(10) Patent No.: US 10,424,523 B2
(45) Date of Patent: Sep. 24, 2019

(54) HERMETICALLY SEALED MOLECULAR SPECTROSCOPY CELL WITH BURIED GROUND PLANE

(71) Applicant: TEXAS INSTRUMENTS INCORPORATED, Dallas, TX (US)

(72) Inventors: Adam Joseph Fruehling, Garland, TX (US); Juan Alejandro Herbsommer, Allen, TX (US); Simon Joshua Jacobs, Lucas, TX (US); Benjamin Stassen Cook, Addison, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/697,505

(22) Filed: Sep. 7, 2017

(65) Prior Publication Data

US 2019/0074233 A1 Mar. 7, 2019

(51) Int. Cl.
*H01L 23/08* (2006.01)
*B81C 1/00* (2006.01)
*H01L 21/768* (2006.01)

(52) U.S. Cl.
CPC .......... *H01L 23/08* (2013.01); *B81C 1/00047* (2013.01); *B81C 1/00333* (2013.01); *H01L 21/76898* (2013.01); *B81B 2203/0315* (2013.01); *B81C 2203/0136* (2013.01); *B81C 2203/0145* (2013.01)

(58) Field of Classification Search
CPC .......................... H01L 23/08; H01L 21/76898
See application file for complete search history.

(56) References Cited

U.S. PATENT DOCUMENTS

| | | |
|---|---|---|
| 4,147,431 A | 4/1979 | Mann |
| 4,826,616 A | 5/1989 | Tanino |

(Continued)

FOREIGN PATENT DOCUMENTS

| | | |
|---|---|---|
| JP | 6428974 | 1/1989 |
| WO | 2014037016 | 3/2014 |
| WO | 2016161215 | 10/2016 |

OTHER PUBLICATIONS

International Search Report for PCT/US2018/049513 dated Nov. 15, 2018.

(Continued)

*Primary Examiner* — Errol V Fernandes
(74) *Attorney, Agent, or Firm* — Michael A. Davis, Jr.; Charles A. Brill; Frank D. Cimino (57) ABSTRACT

A method for forming a sealed cavity includes bonding a non-conductive structure to a first substrate to form a non-conductive aperture into the first substrate. On a surface of the non-conductive structure opposite the first substrate, the method includes depositing a first metal layer. The method further includes patterning a first iris in the first metal layer, depositing a first dielectric layer on a surface of the first metal layer opposite the non-conductive structure, and patterning an antenna on a surface of the first dielectric layer opposite the first metal layer. The method also includes creating a cavity in the first substrate, depositing a second metal layer on a surface of the cavity, patterning a second iris in the second metal layer, and bonding a second substrate to a surface of the first substrate opposite the non-conductive structure to thereby seal the cavity.

10 Claims, 8 Drawing Sheets

(56) References Cited

U.S. PATENT DOCUMENTS

| | | |
|---|---|---|
| 5,107,231 A | 4/1992 | Knox |
| 5,198,786 A | 3/1993 | Russell et al. |
| 5,218,373 A | 6/1993 | Heckaman et al. |
| 5,412,186 A | 5/1995 | Gale |
| 5,459,324 A | 10/1995 | Fima |
| 5,821,836 A | 10/1998 | Katehi et al. |
| 6,131,256 A | 10/2000 | Dydyk et al. |
| 6,236,366 B1 | 5/2001 | Yamamoto et al. |
| 6,362,706 B1 | 3/2002 | Song et al. |
| 6,498,550 B1 | 12/2002 | Miller et al. |
| 6,630,359 B1 | 10/2003 | Caillat et al. |
| 6,670,866 B2 | 12/2003 | Ella et al. |
| 6,842,088 B2 | 1/2005 | Yamada et al. |
| 6,989,723 B2 | 1/2006 | Komuro et al. |
| 7,388,454 B2 | 6/2008 | Ruby et al. |
| 7,408,428 B2 | 8/2008 | Larson, III |
| 8,098,208 B2 | 1/2012 | Ficker et al. |
| 8,268,642 B2 | 9/2012 | Yoshitomi et al. |
| 8,293,661 B2 | 10/2012 | Yamazaki |
| 8,586,178 B2 | 11/2013 | Schwanke et al. |
| 9,436,902 B1 | 9/2016 | Koepp et al. |
| 9,529,334 B2 | 12/2016 | Herbsommer et al. |
| 9,735,754 B2 | 8/2017 | Shin et al. |
| 2002/0038989 A1 | 4/2002 | Larson, III |
| 2002/0068018 A1 | 6/2002 | Pepper et al. |
| 2002/0098611 A1 | 7/2002 | Chang et al. |
| 2003/0015707 A1 | 1/2003 | Bosco et al. |
| 2003/0048500 A1 | 3/2003 | Fala et al. |
| 2003/0107459 A1 | 6/2003 | Takahashi et al. |
| 2004/0142484 A1 | 7/2004 | Berlin et al. |
| 2004/0166577 A1 | 8/2004 | Storek et al. |
| 2005/0023932 A1 | 2/2005 | Inoue et al. |
| 2006/0076632 A1* | 4/2006 | Palmateer ........... B81C 1/00285 |
| | | 257/414 |
| 2006/0144150 A1 | 7/2006 | Wu |
| 2007/0189359 A1 | 8/2007 | Chen et al. |
| 2008/0319285 A1 | 12/2008 | Hancock |
| 2010/0182102 A1 | 7/2010 | Kuypers et al. |
| 2010/0327701 A1 | 12/2010 | Grannen et al. |
| 2011/0140971 A1 | 6/2011 | Schwanke et al. |
| 2012/0266681 A1 | 10/2012 | Baumann et al. |
| 2013/0176703 A1 | 7/2013 | Hopper et al. |
| 2014/0155295 A1 | 6/2014 | Hindson et al. |
| 2014/0210835 A1 | 7/2014 | Hong et al. |
| 2014/0347074 A1* | 11/2014 | Nadeau ................ G01N 22/00 |
| | | 324/639 |
| 2014/0368376 A1* | 12/2014 | Nadeau ................ G01N 22/00 |
| | | 342/174 |
| 2014/0368377 A1* | 12/2014 | Nadeau ................... H03L 7/26 |
| | | 342/192 |
| 2014/0373599 A1* | 12/2014 | Trombley .......... G01N 29/2431 |
| | | 73/24.02 |
| 2015/0144297 A1 | 5/2015 | Toivonen et al. |
| 2015/0277386 A1 | 10/2015 | Passilly et al. |
| 2016/0091663 A1 | 3/2016 | Taylor |
| 2016/0233178 A1 | 8/2016 | Lamy et al. |
| 2017/0073223 A1 | 3/2017 | Nasiri et al. |
| 2017/0125660 A1 | 5/2017 | Stephanou et al. |
| 2017/0130102 A1 | 5/2017 | Campbell et al. |
| 2018/0159547 A1* | 6/2018 | Herbsommer ............ H03L 7/26 |

OTHER PUBLICATIONS

International Search Report for PCT/US2018/049940 dated Dec. 13, 2018.

International Search Report for PCT/US2018/049949 dated Dec. 13, 2018.

International Search Report for PCT/US2018/049949 dated Dec. 27, 2018.

International Search Report for PCT/US2018/047105 dated Dec. 27, 2018.

International Search Report for PCT/US2018/050253 dated Jan. 10, 2019.

Alvarez, A.L. et al; "The Application of Microencapsulation Techniques in the Treatment of Endodontic and Periodontal Diseases" Pharmaceutics; 2011 abstract p. 540-548.

Steinberg, D. et al; "A New Degradable Controlled Release Device for Treatment of Periodontal Disease: In Vitro Release Study"; J. Periodontology; 1990; p. 393 lines 1-17; p. 394 col. 1 lines 5-14.

Xiong, R. et al.; "Towards Theranostic Multicompartment Microcapsules: in situ Diagnostics and Laser-induced Treatment", Theranostics; 2013; pp. 145-149.

* cited by examiner

HERMETICALLY SEALED MOLECULAR SPECTROSCOPY CELL WITH BURIED GROUND PLANE

BACKGROUND

Various applications may include a sealed chamber formed in a semiconductor structure. Although there are numerous applications of sealed chamber, in one particular application, a chip-scale atomic dock may include a selected vapor at a low pressure in a sealed chamber. Forming such structures can be a challenge.

SUMMARY

Methods for forming a hermetically sealed cavity, and the resulting cavity, are described herein. In one embodiment, a method for forming a sealed cavity includes bonding a non-conductive structure to a first substrate to form a non-conductive aperture into the first substrate. On a surface of the non-conductive structure opposite the first substrate, the method includes depositing a first metal layer. The method further includes patterning a first iris in the first metal layer, depositing a first dielectric layer on a surface of the first metal layer opposite the non-conductive structure, and patterning an antenna on a surface of the first dielectric layer opposite the first metal layer. The method also includes the deposition or bonding of further dielectric and metal layers and their subsequent patterning on the topmost surface to improve the radio frequency (RF) performance of antenna, transmission line structures, and electromagnetic bandgap structures. The method also includes creating a cavity in the first substrate, depositing a second metal layer on a surface of the cavity, patterning a second iris in the second metal layer, and bonding a second substrate to a surface of the first substrate opposite the non-conductive structure to thereby seal the cavity.

Another embodiment includes a device that includes a non-conductive structure and a first substrate bonded to the non-conductive structure. The first substrate includes a cavity that extends from the non-conductive structure to a surface of the first substrate opposite the non-conductive structure. The device further includes a second substrate bonded to the first substrate to seal the cavity, a plurality of dipolar molecules disposed within the cavity, a first metal layer on a surface of the non-conductive structure opposite the first substrate, a first dielectric layer on a surface of the first metal layer opposite the non-conductive structure, and a first antenna patterned on a surface of the first dielectric layer opposite the first metal layer.

In yet another embodiment, a device includes a glass sheet and a first semiconductor substrate bonded to the glass sheet. The first semiconductor substrate includes a cavity that extends from the glass sheet to a surface of the first semiconductor substrate opposite the glass sheet. The device also includes a second semiconductor substrate bonded to the first semiconductor substrate to seal the cavity, a plurality of dipolar molecules disposed within the cavity, a first metal layer on a surface of the glass sheet opposite the first semiconductor substrate, a first dielectric layer on a surface of the first metal layer opposite the glass sheet, and first and second antennas patterned on a surface of the first dielectric layer opposite the first metal layer. The device further includes a transceiver electrically coupled to the first and second antennas and configured to inject a transmit signal into the cavity through the first antenna, generate an error signal based on the transmit signal and a receive signal from the second antenna, and dynamically adjust a frequency of the transmit signal based on the error signal

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different parties may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The disclosed embodiments of the present disclosure include techniques to fabricate a hermetically sealed cavity in a substrate. A structure containing a substrate with the cavity may be used in numerous applications. One illustrative use is as a millimeter wave chip scale atomic clock. The cavity contains a plurality of dipolar molecules (e.g., water molecules) at a relatively low pressure. For some embodiments, the pressure is approximately 0.1 mbarr for water molecules. If argon molecules were used, the pressure may be several atmospheres. The hermetically sealed cavity contains selected dipolar molecules at a pressure chosen to optimize the amplitude of a signal absorption peak of the molecules detected at an output of the cavity. An electromagnetic signal is injected through aperture into the cavity. Through closed-loop control, the frequency of the signal is dynamically adjusted to match the frequency corresponding to the absorption peak of the molecules in the cavity. The frequency produced by quantum rotation of the selected dipolar molecules may be unaffected by circuit aging and may not vary with temperature or other environmental factors.

While a variety of materials and manufacturing operations can be employed, one illustrative method includes bonding a non-conductive structure (e.g., glass) to a first substrate (e.g., a semiconductor wafer) to form a non-conductive aperture into the first substrate. On a surface of the non-conductive structure opposite the first substrate, the method includes depositing a first metal layer. A first iris is patterned on the first metal layer. The method further includes depositing a first dielectric layer on a surface of the first metal layer opposite the non-conductive structure, patterning an antenna on a surface of the first dielectric layer opposite the first metal layer, and creating a cavity in the first substrate. Further, the method includes depositing a second metal layer on a surface of the cavity, patterning a second iris in the second metal layer, and bonding a second substrate (e.g., another semiconductor wafer) to a surface of the first substrate opposite the non-conductive structure to thereby seal the cavity.

FIGS. 1A-1I illustrate a sequence of process steps to fabricate a hermetically sealed cavity in accordance with an embodiment. At FIG. 1A, a non-conductive structure 102 is bonded to a substrate 120 to form a non-conductive aperture for the substrate 120. In some embodiments, the non-conductive structure 102 comprises glass, but the non-conductive structure 102 can be other than glass in other embodiments such as ceramic and silicon. The substrate 120 is a semiconductor substrate (e.g., silicon) in some embodiments, but can be other than a semiconductor substrate in other embodiments, such as a ceramic material or a metallic cavity. In one example, a glass sheet (e.g., 130 micrometers thick) is bonded to a surface of a semiconductor wafer. The process to bond the non-conductive structure 102 to the substrate 120 may comprise an anodic, fusion, eutectic solder, transition liquid phase (TLP), cofiring, or other suitable bonding processes.

Figure 1A:
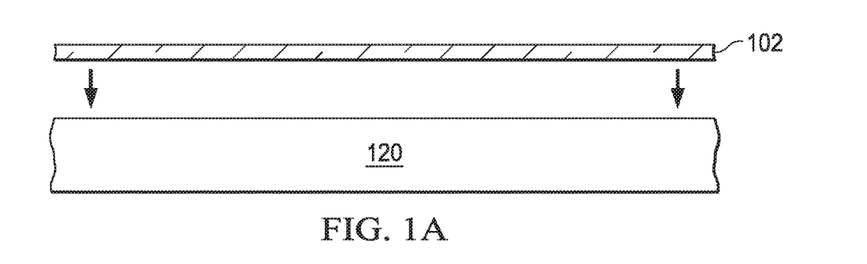
FIGS. 1A-1I illustrate a sequence of processing operations in one embodiment to form a hermetically sealed cavity.
Figure 1B:
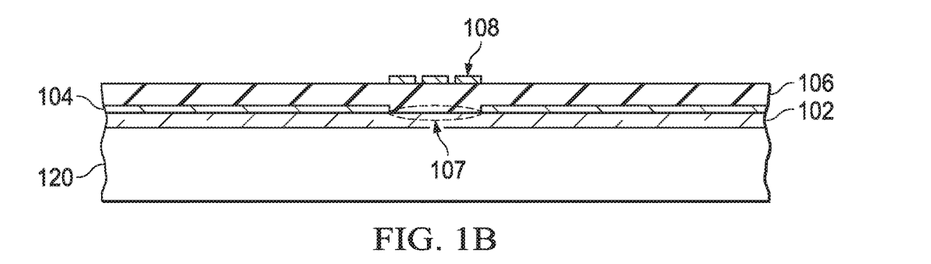

FIG. 1B illustrates that a metal layer 104 has been deposited on a surface of the non-conductive structure 102 opposite the substrate 120. The metal layer 104 include any suitable metal material such as copper, gold, etc. The metal layer 104 is a ground plane. An iris 107 has been patterned in the metal layer 104. The iris is patterned by removing a portion of the metal layer 104 (e.g., by wet etch, dry etch, liftoff, or other suitable processes) FIG. 1B also illustrates a first dielectric layer 106 deposited on a surface of the metal layer 104 opposite the non-conductive structure 102. The first dielectric layer 106 comprises any suitable type of dielectric material such as polymide, nitride, or oxide. An antenna 108 has been patterned on a surface of the first dielectric layer 106 opposite the metal layer 104. The antenna 108 comprises a conductive material such as copper or gold and an electrical signal can be provided to the antenna or received from the antenna. In some embodiments, one antenna is used to both transmit and receive signals. In other embodiments, a pair of antennas is patterned on the dielectric layer, and one antenna is used to inject a signal into the cavity and another antenna is used to receive a signal from the cavity. In such examples, the antennas are located at or near opposite ends of the cavity.

Figure 1C:
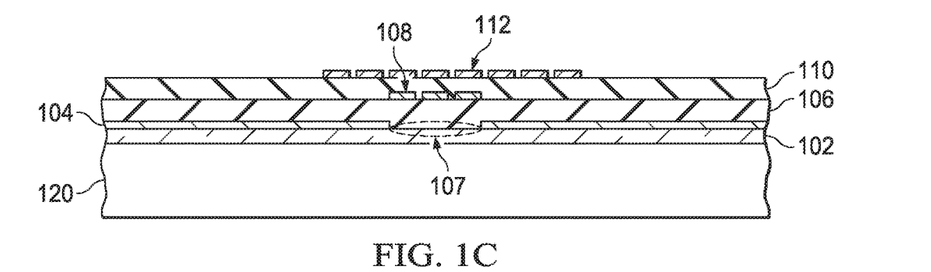

FIG. 1C illustrates that a second dielectric layer 110 has been deposited on a surface of the first dielectric layer 106 opposite the metal layer 104. The second dielectric layer 110 covers some or all of the antenna 108 as well. The second dielectric layer 110 comprises the same type of material as the first dielectric layer, or may comprise a different type of dielectric material as the first dielectric layer. An electronic bandgap (EBG) structure 112 also is deposited and patterned on a surface of the second dielectric layer 110 opposite the first dielectric layer 106. In operation, the EBG structure 112 attenuates electromagnetic wave coupling along the outer surface 111 of the second dielectric layer 110 between the antennas. The EBG structure 112 helps to force the energy from the input signal received through an antenna (e.g., antenna 108) into the cavity 125. Layers 110 and 112 are used to enhance the performance of the feed structure patterned on antenna 108. Layers 110 and 112 also serve as a reflector/ground plane to improve antenna efficiency for the transmission or reception of the signal passed through the cavity.

Figure 1D:
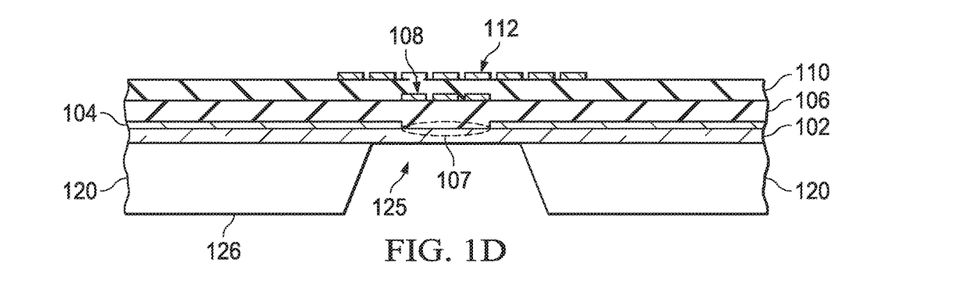
Figure 1E:
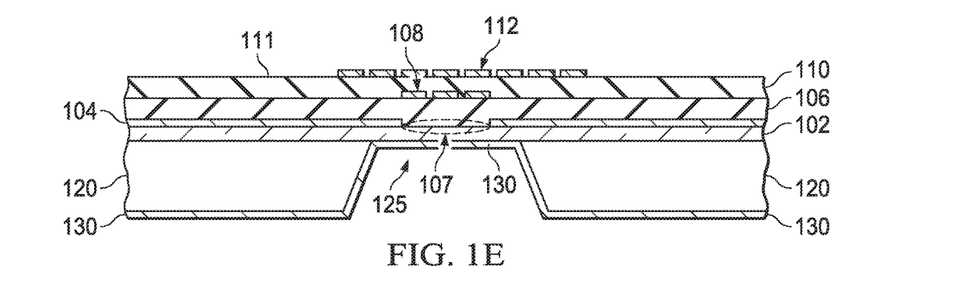

In the example of FIG. 1D, a cavity 125 has been created in the substrate 120. The cavity 125 may be wet etched into the substrate 120 using a suitable wet etchant such as potassium hydroxide (KOH) or tetramethylammonium hydroxide (TMAH). Alternatively, the cavity 125 can be formed by way of reactive-ion etching (RIE), deep reactive-ion etching (DRIE), or isotropic etching. The cavity 125 is etched from the surface 126 of the substrate 120 opposite the non-conductive structure 102 to the non-conductive structure 102 thereby exposing a portion of the non-conductive structure 102. FIG. 1E illustrates that another metal layer 130 has been deposited on a surface of the substrate 120 opposite the non-conductive structure 102. The metal layer 130 also is deposited in the cavity 125 as shown.

Figure 1F:
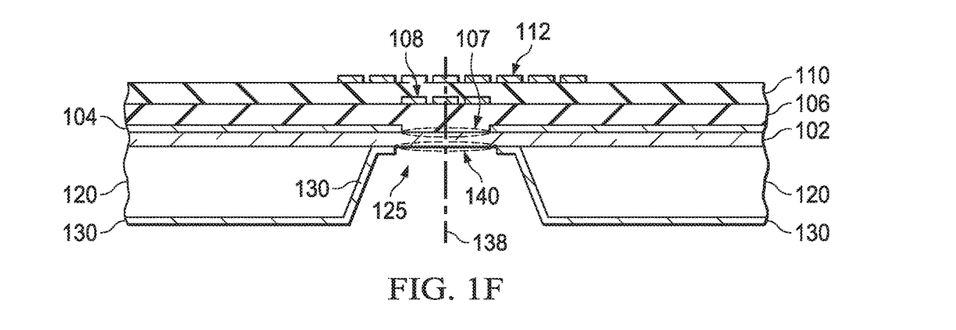

FIG. 1F illustrates that another iris 140 is created in the second metal layer 130 within the cavity 125. The iris 140 is patterned in the second metal layer 130 so that irises 107 and 140 align along a vertical axis 138 through the non-conductive structure.

Figure 1G:
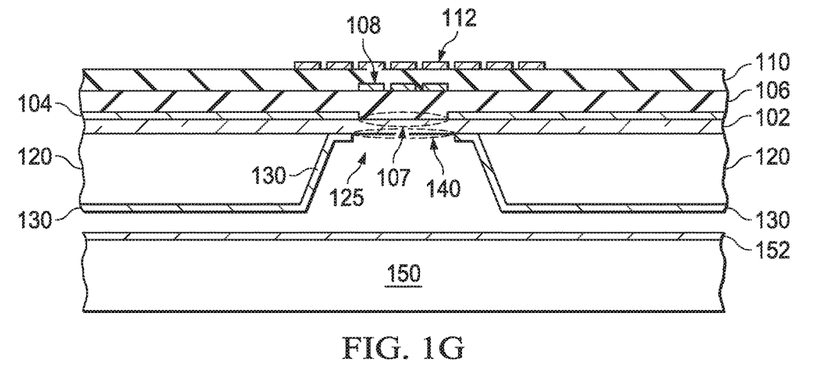
Figure 1H:
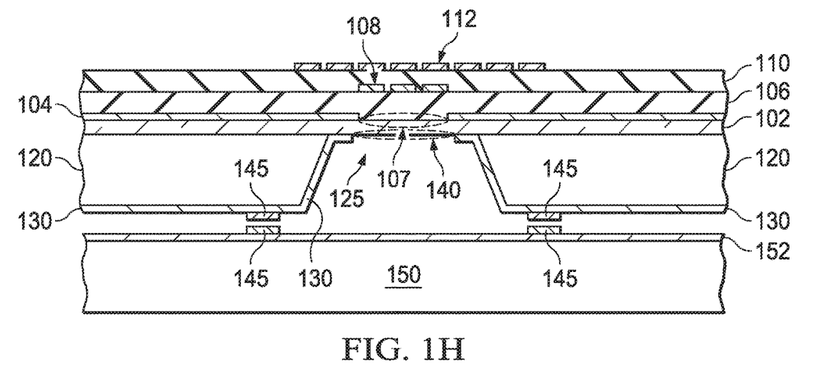
Figure 1I:
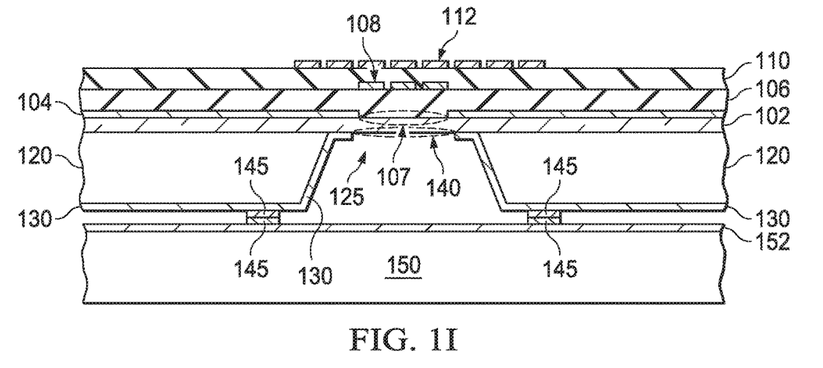

FIG. 1G shows another substrate 150 on which a metal layer 152 has been deposited. The substrate 150 comprises the same or different material as substrate 120. In one example, the substrate 150 comprises a semiconductor substrate such as a silicon wafer, but can be other than a semiconductor material in other examples. FIG. 1H illustrates that bonding structures 145 are deposited and patterned on either or both of the substrates 120 and 150. In one example, the bonding structures comprise a gold, aluminum, silicon or other types of material that form an alloy when heated to a suitable temperature. FIG. 1I illustrates the resulting device which includes a hermetically sealed cavity. Dipolar molecules are trapped inside the cavity 125. The hermetically sealed cavity 125 contains dipolar molecules (e.g., water molecules) at an internal pressure of less than, in one example, 0.15 mbars.

Figure 2:
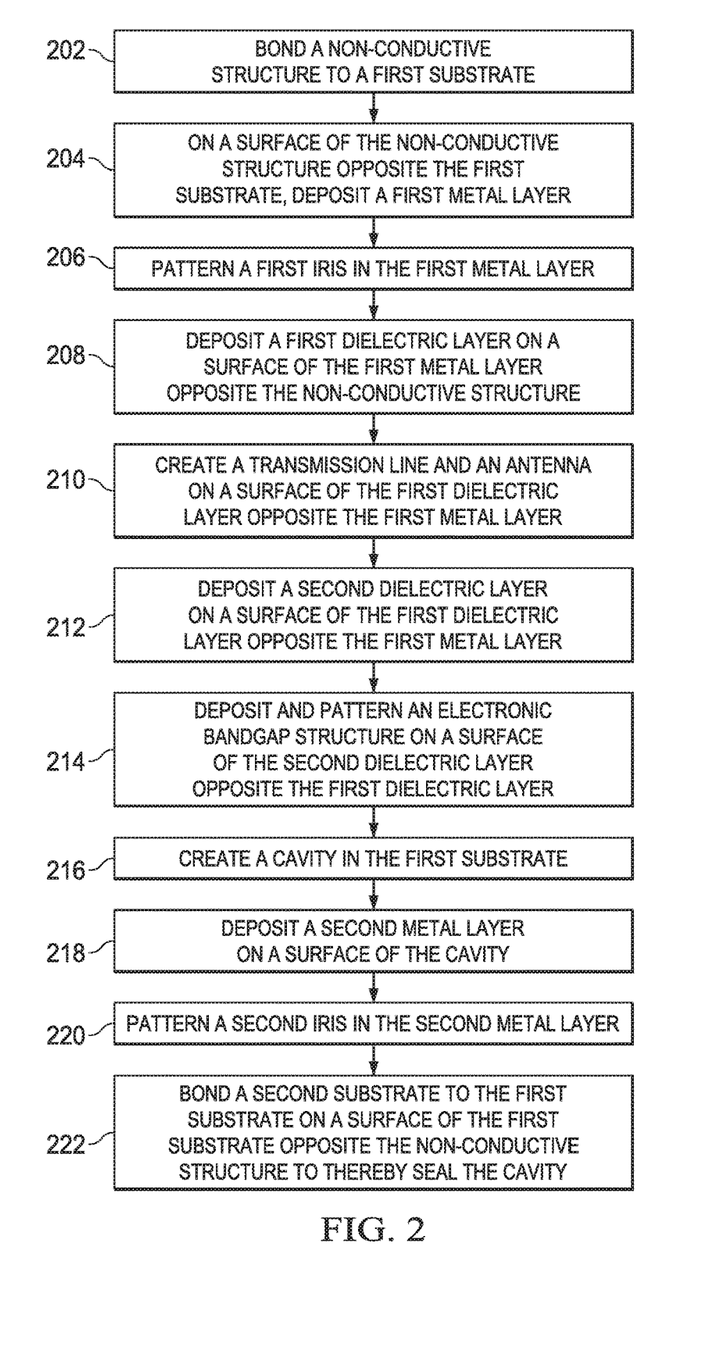
FIG. 2 illustrates a method flow chart to form a hermetically sealed cavity in accordance with various embodiments.

The flow chart of FIG. 2 illustrates a method in accordance with an example. The operations may be performed in the order shown, or in a different order. Further, the operations may be performed sequentially, or two or more of the operations may be performed concurrently.

At 202, the method includes bonding a non-conductive structure (e.g., glass) to a first substrate (e.g., a semiconductor wafer) to form a non-conductive aperture into the first substrate. On a surface of the non-conductive structure opposite the first substrate, the method further includes at 204 depositing a first metal layer (e.g., metal layer 104). At 206, the method includes patterning a first iris in the first metal layer. Patterning the iris may comprise etching the first metal layer. At 208, the method includes depositing a first dielectric layer (e.g., dielectric layer 106) on a surface of the first metal layer opposite the non-conductive structure (e.g., non-conductive structure 102) and, at 210, patterning a transmission line and an antenna (e.g., antenna 108) on a surface of the first dielectric layer opposite the first metal layer.

At 212, the method includes depositing a second dielectric layer (e.g., dielectric layer 110) on a surface of the first dielectric layer (e.g., dielectric layer 106) opposite the first metal layer (e.g., metal layer 104). An EBG structure (e.g., EBG structure 112) is deposited and patterned on a surface of the second dielectric layer opposite the first dielectric layer (operation 214). A cavity (e.g., cavity 125) is then created at 216 in the first substrate. The cavity may be created by wet etching the first substrate.

At 218, the method includes depositing a second metal layer (e.g., metal layer 130) on a surface of the cavity. The second metal layer also is deposited on the first substrate outside the cavity itself such as is shown in the example of FIG. 1E. At 220, a second iris (e.g., iris 140) is patterned in the second metal layer such as is illustrated in FIG. 1F, and, at 222, a second substrate (e.g., substrate 150) is bonded to the first substrate on a surface of the first substrate opposite the non-conductive structure to thereby seal the cavity.

FIGS. 3A-3E illustrate a sequence of process steps to fabricate a hermetically sealed cavity in accordance with another embodiment. At FIG. 3A, a non-conductive structure 302 is bonded to a substrate 320 to form a non-conductive aperture for the substrate 320. In some embodiments, the non-conductive structure 302 comprises glass, but the non-conductive structure 302 can be other than glass in other embodiments such as ceramic, silicon, or oxide/nitride. The substrate 320 is a semiconductor substrate (e.g., silicon) in some embodiments, but can be other than a semiconductor substrate in other embodiments, such as a ceramic material or metallic cavity. In one example, a glass sheet (e.g., 130 micrometers thick) is bonded to a surface of a semiconductor wafer. The process to bond the non-conductive structure 302 to the substrate 320 may comprise an anodic, fusion, eutectic solder, transition liquid phase (TLP), cofiring, or other suitable bonding processes.

Figure 3A:
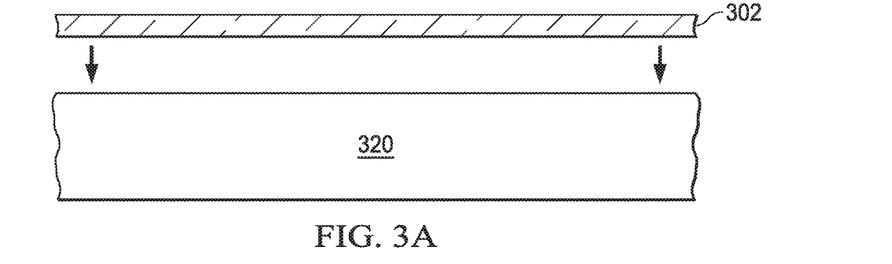
FIGS. 3A-3E illustrate a sequence of processing operations in accordance with another embodiment to form a hermetically sealed cavity.
Figure 3B:
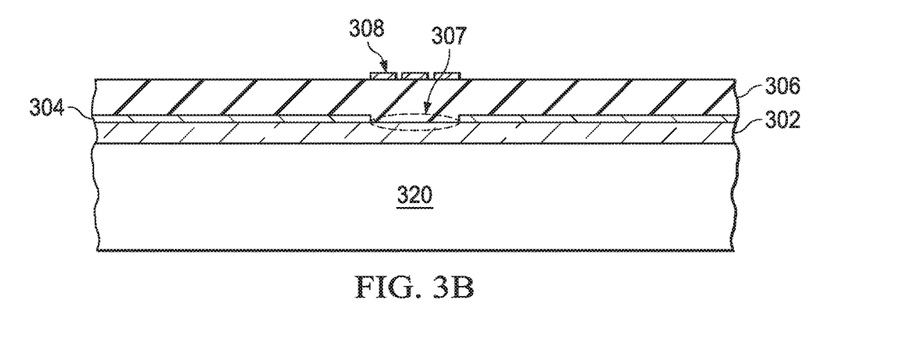

FIG. 3B illustrates that a metal layer 304 has been deposited on a surface of the non-conductive structure 302 opposite the substrate 320. The metal layer 304 includes any suitable metal material such as copper, gold, etc. The metal layer 304 is a ground plane. An iris 307 has been patterned in the metal layer 304. FIG. 3B also illustrates a first dielectric layer 306 deposited on a surface of the metal layer 304 opposite the non-conductive structure 302. The first dielectric layer 306 comprises any suitable type of dielectric material such as polymide, nitride, or oxide. An antenna 308 has been patterned on a surface of the first dielectric layer 306 opposite the metal layer 304. The antenna 308 comprises a conductive material such as copper or gold and an electrical signal can be provided to the antenna or received from the antenna. In some embodiments, one antenna is used to both transmit and receive signals. In other embodiments, a pair of antennas is patterned on the dielectric layer, and one antenna is used to inject a signal into the cavity and another antenna is used to receive a signal from the cavity. In such examples, the antennas are located at or near opposite ends of the cavity.

Figure 3C:
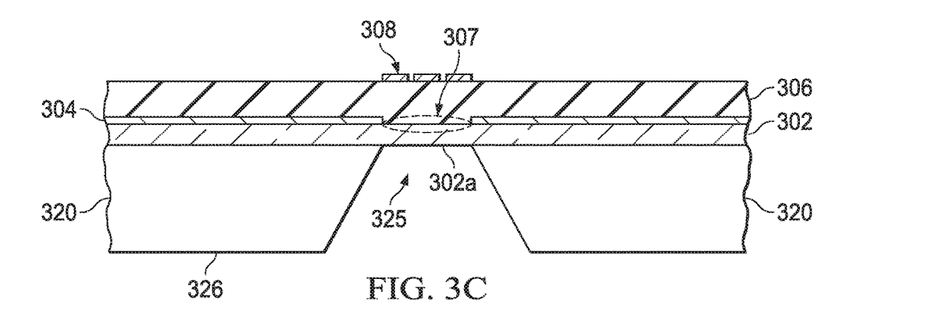
Figure 3D:
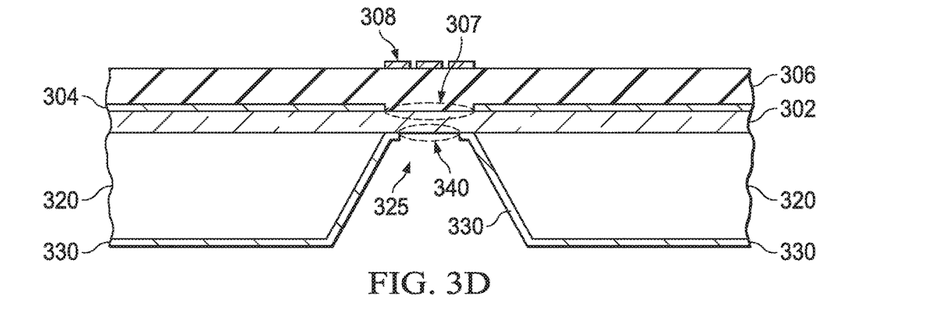
Figure 3E:
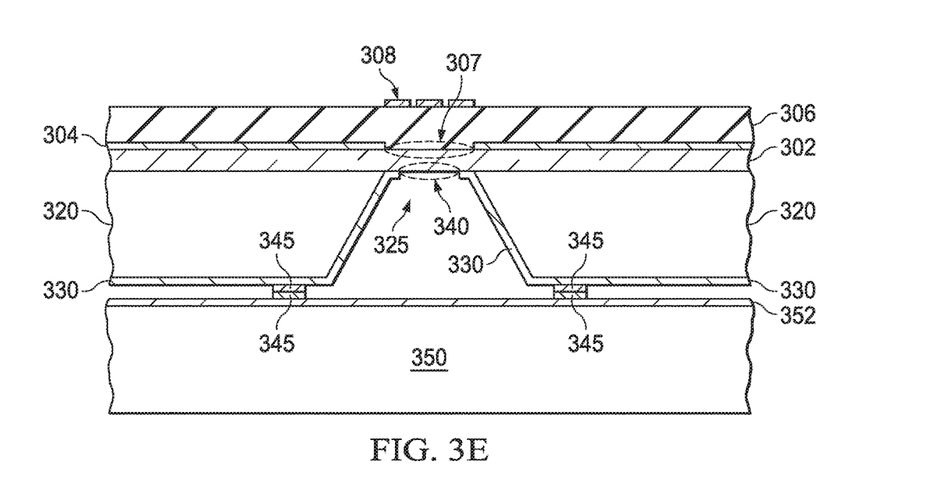

In FIG. 3C, a cavity 325 has been created in the substrate 320. The cavity 325 may be wet etched into the substrate 120 using a suitable wet etchant such as potassium hydroxide (KOH) or tetramethylammonium hydroxide (TMAH). The cavity 325 is etched from the surface 326 of the substrate 320 opposite the non-conductive structure 302 to the non-conductive structure 302 thereby exposing a portion of the non-conductive structure 302. FIG. 3D illustrates that another metal layer 330 has been deposited on a surface of the substrate 320 opposite the non-conductive structure 302. The metal layer 330 also is deposited in the cavity 325 as shown. An iris 340 is etched in the metal layer 330 as explained above with regard to FIG. 1F. FIG. 3E illustrates another substrate 350 on which a metal layer 352 has been deposited. The substrate 350 comprises the same or different material as substrate 320. In one example, the substrate 350 comprises a semiconductor substrate such as a silicon wafer, but can be other than a semiconductor material in other examples. Bonding structures 345 have been deposited and patterned on either or both of the substrates 320 and 350. In one example, the bonding structures comprise a gold, aluminum, silicon or other types of material that form an alloy when heated to a suitable temperature. By way of the bonding structures 345, the substrates 320 and 350 are bonded together.

Figure 4:
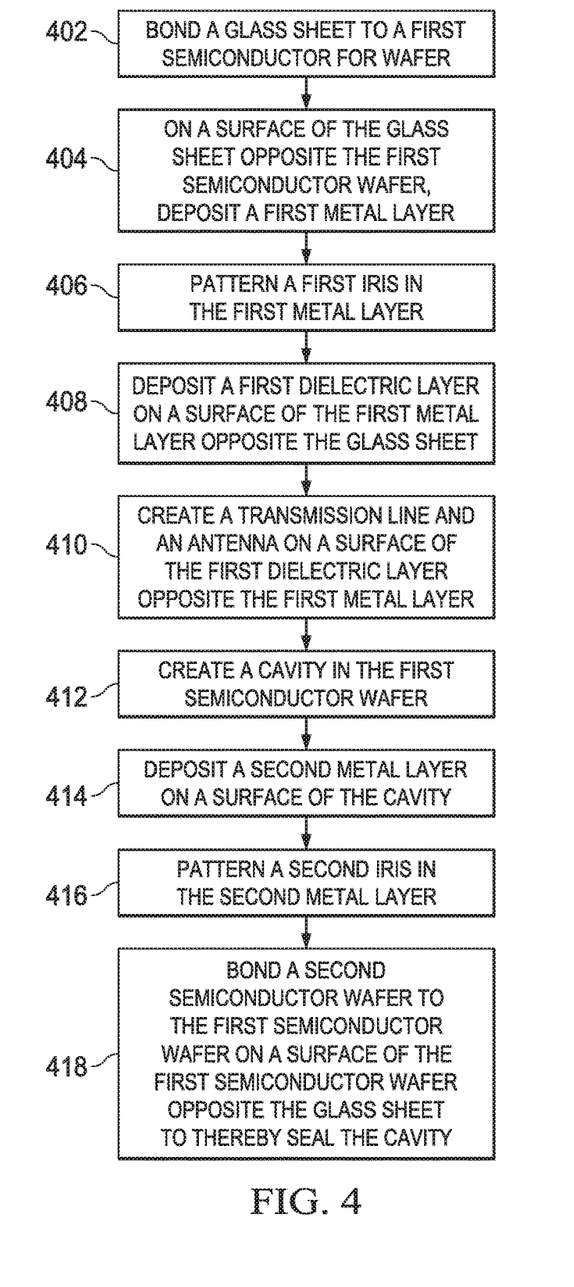
FIG. 4 illustrates another method flow chart to form a hermetically sealed cavity in accordance with various embodiments

The flow chart of FIG. 4 illustrates a method in accordance with various examples. The operations may be performed in the order shown, or in a different order. Further, the operations may be performed sequentially, or two or more of the operations may be performed concurrently. Some of the operations are the same or similar as in the flow chart of FIG. 2.

At 402, the method includes bonding a non-conductive structure (e.g., glass) to a first substrate (e.g., a semiconductor wafer) to form a non-conductive aperture into the first substrate. On a surface of the non-conductive structure opposite the first substrate, the method further includes at 404 depositing a first metal layer (e.g., metal layer 304). At 406, the method includes patterning a first iris in the first metal layer. Patterning the iris comprises etching the first metal layer. At 408, the method includes depositing a first dielectric layer on a surface of the first metal layer opposite the non-conductive structure and, at 410, patterning a transmission line and an antenna on a surface of the first dielectric layer opposite the first metal layer. A cavity is created at 412 in the first substrate. At 414, the method includes depositing a second metal layer on a surface of the cavity. At 416 and 418, the method further includes patterning a second iris in the second metal layer and bonding a second substrate to a surface of the first substrate opposite the non-conductive structure to thereby seal the cavity.

Figure 5:
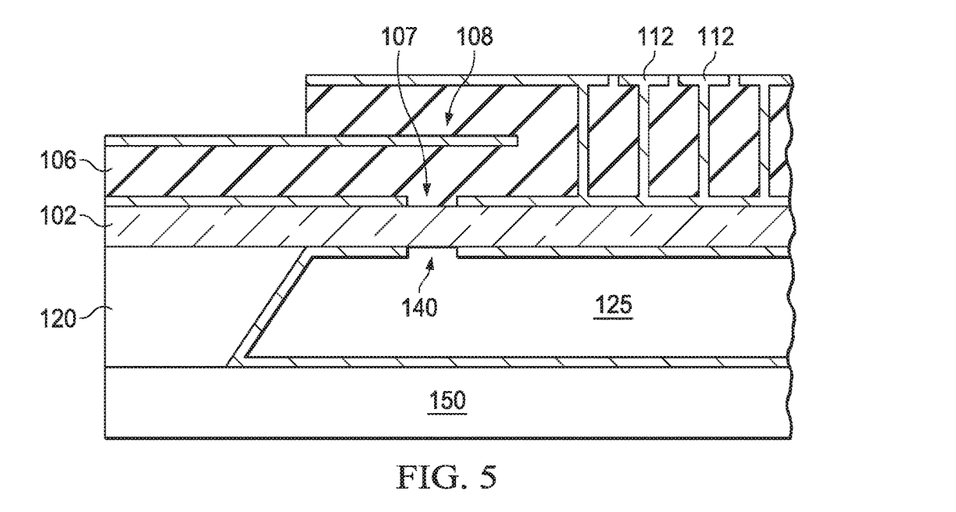
FIG. 5 shows a cross-sectional view of the hermetically sealed cavity of various embodiments.

FIG. 5 shows a cross-sectional view of a structure in accordance with the disclosed embodiments. The structure comprises a millimeter wave chip scale atomic clock. Substrate 120 is shown bonded to substrate 150 with a hermetically sealed cavity 125 formed in the substrate 120 and sealed at least in part by substrate 150. The non-conductive structure (e.g., glass) 102 is shown bonded to the substrate 120 and irises 107 and 140 permit electromagnetic energy to pass through the non-conductive structure 102 from the antenna 108 in the cavity 125. An example of the EBG structure 112 also is shown in FIG. 5. Layer 104 provides a common ground plane for all RF structures external to the cavity 125. In addition, it limits propagation of waves travelling in either layers 120 or 102. Layers 110 and 112 form transmission structures, such as a stripline, for feeding RF signals to the antenna 108. In the proximity of the antenna 108, it can also serve as a ground reflector or defected ground structure. The dimensions of the waveguide, antenna, EBG, and size and positioning of the iris 140 are all design considerations based on the chosen molecular species inside the cavity and the wavelength of the interrogation waveform within the cavity. The required bandwidth of the structure depends upon the fabrication tolerances achievable in manufacturing.

Figure 6:
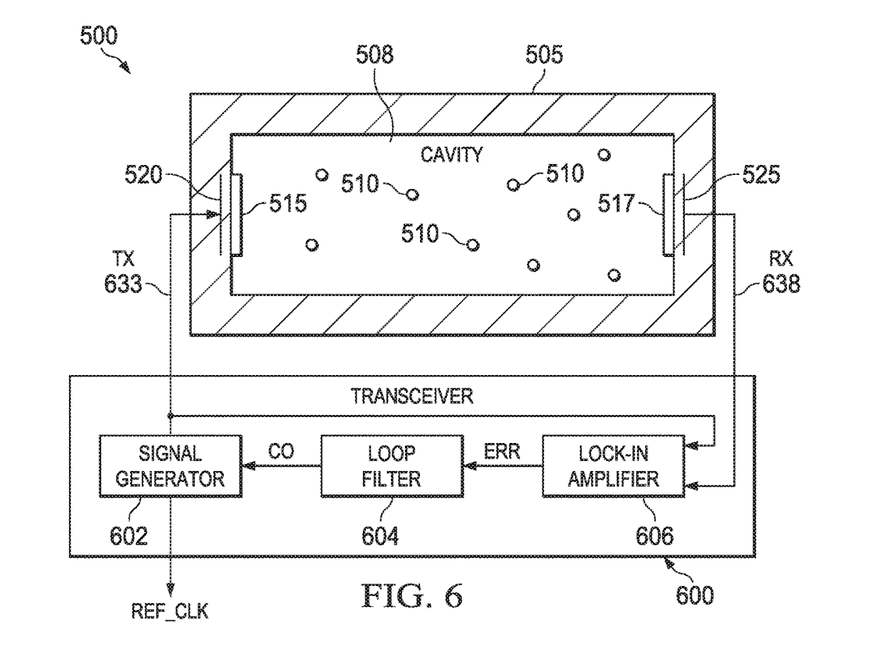
FIG. 6 shows a block diagram for a clock generator in accordance with various embodiments.

FIG. 6 shows a block diagram for a clock generator 500 accordance with various embodiments. The clock generator 500 is a millimeter wave atomic clock that generates a reference frequency based on the frequency of quantum rotation of selected dipolar molecules contained in a hermetically sealed cavity 102 formed in semiconductor material. The reference frequency produced by quantum rotation of the selected dipolar molecules is unaffected by circuit aging and does not vary with temperature or other environmental factors.

The clock generator 500 of FIG. 6 includes a vapor cell 505 formed in this example from substrates as described above. The cell 505 includes a cavity 508 with a sealed interior enclosing a dipolar molecule material gas, for example, water ($H_2O$) or any other dipolar molecule gas at a relatively low gas pressure inside the cavity 125. Non-limiting examples of suitable electrical dipolar material gases include water, acetonitrile ($CH_3CN$) and hydrogen cyanide (HCN). As shown in FIG. 6, the clock generator 500 further includes a transceiver 600 with a transmit output 633 for providing an electrical transmit signal (TX) to the vapor cell 505, as well as a receiver input 638 for receiving an electrical input signal (RX) from the vapor cell 525. The rotational transition vapor cell 525 does not require optical interrogation, and instead operates through electromagnetic interrogation via the transmit and receive signals (TX, RX) provided by the transceiver 600.

The sealed cavity 508 includes a conductive interior cavity surface, as well as first and second non-conductive apertures 515 and 517 formed in the interior cavity surface for providing an electromagnetic field entrance and an electromagnetic field exit, respectively. In one example, the apertures 515, 517 magnetically couple into the TE10 mode of the cavity 508. In other examples, the apertures 515, 517 excite higher order modes. First and second conductive coupling structures 520 and 525 are formed on an outer surface of the vapor cell 505 proximate the first and second non-conductive aperture 515 and 517, respectively. The coupling structures 520, 525 may be the antennas described above and may comprise a conductive strip formed on a surface of one of the substrates forming the cell 505. Each coupling structure 520, 525 overlies and crosses over the corresponding non-conductive aperture 515, 517 for providing an electromagnetic interface to couple a magnetic field in to (based on the transmit signal TX from the transceiver output 633) the cavity 508 or from the cavity to the transceiver RX input 638 The proximate location of the conductive coupling structures 520, 525 and the corresponding non-conductive apertures 515, 525 advantageously provides electromagnetically transmissive paths through the second or upper substrate 106, which can be any electromagnetically transmissive material.

The transceiver circuit 600 in certain implementations is implemented on or in an integrated circuit (not shown), to which the vapor cell 505 is electrically coupled for transmission of the TX signal via the output 633 and for receipt of the RX signal via the input 638. The transceiver 600 is operable when powered for providing an alternating electrical output signal TX to the first conductive coupling structure 520 for coupling an electromagnetic field to the interior of the cavity 508, as well as for receiving the alternating electrical input signal RX from the second conductive coupling structure 525 representing the electromagnetic field received from the cavity 508. The transceiver circuit 600 is operable for selectively adjusting the frequency of the electrical output signal TX in order to reduce the electrical input signal RX by interrogation to operate the clock generator 500 at a frequency which substantially maximizes the molecular absorption through rotational motor state transitions, and for providing a reference clock signal REF_CLK at the frequency of the TX output signal.

In certain examples, the transceiver 600 includes a signal generator 602 with an output 633 electrically coupled with the first conductive coupling structure 520 for providing the alternating electrical output signal TX, and for providing the reference clock signal REF_CLK at the corresponding transmit output frequency. The transceiver 600 also includes a lock-in amplifier circuit 606 with an input 638 coupled from the second conductive coupling structure 525 for receiving the RX signal. The lock-in amplifier operates to provide an error signal ERR representing a difference between the RX signal and the electrical output signal TX. In one example, the lock-in amplifier 606 provides the error signal ERR as an in-phase output, and the error signal ERR is used as an input by a loop filter 604 to provide a control output signal (CO) to the signal generator 602 for selectively adjusting the TX output signal frequency to maintain this frequency at a peak absorption frequency of the dipolar molecular gas inside the sealed interior of the cavity 508. In some examples, the RF power of the TX and RX loop is controlled so as to avoid or mitigate stark shift affects.

The electromagnetic coupling via the non-conductive apertures 520, 525 and corresponding conductive coupling structures 515, 517 facilitates electromagnetic interrogation of the dipolar gas within the cell cavity 508. In one non-limiting form of operation, the clock generator 500 operates with the signal generator 602 transmitting alternating current (AC) TX signals at full transmission power at various frequencies within a defined band around a suspected quantum absorption frequency at which the transmission efficiency of the vapor cell 505 is minimal (absorption is maximal). For example, the quantum absorption frequency associated with the dipolar water molecule is 183.31 GHz. When the system operates at the quantum frequency, a null or minima is detected at the receiver via the lock-in amplifier 606, which provides the error signal ERR to the loop filter 604 for regulation of the TX output signal frequency via the control output CO signal provided to the signal generator 602. The rotational quantum frequency of the dipolar molecule gas in the vapor cell cavity 508 is generally stable with respect to time (does not degrade or drift over time), and is largely independent of temperature and a number of other variables.

In one embodiment, the signal generator 602 initially sweeps the transmission output frequency through a band known to include the quantum frequency of the cell 505 (e.g., transitioning upward from an initial frequency below the suspected quantum frequency, or initially transitioning downward from an initial frequency above the suspected quantum frequency, or other suitable sweeping technique or approach). The transceiver 600 monitors the received energy via the input 638 coupled with (e.g., electrically connected to) the second conductive coupling structure 525 in order to identify the transmission frequency associated with peak absorption by the gas in the cell cavity 508 (e.g., minimal reception at the receiver). Once the quantum absorption frequency is identified, the loop filter 604 moves the source signal generator transmission frequency close to that absorption frequency (e.g., 183.31 GHz), and modulates the signal at a very low frequency to regulate operation around the null or minima in the transmission efficiency representing the ratio of the received energy to the transmitted energy. The loop filter 604 provides negative feedback in a closed loop operation to maintain the signal generator 602 operating at a TX frequency corresponding to the quantum frequency of the cavity dipolar molecule gas.

In steady state operation, the lock-in amplifier 606 and the loop filter 604 maintain the transmitter frequency at the peak absorption frequency of the cell gas. In one non-limiting example, the loop filter 604 provides proportional-integral-derivative (PID) control using a derivative of the frequency error as a control factor for lock-in detection and closed loop regulation. At the bottom of the null in a transmission coefficient curve, the derivative is zero and the loop filter 604 provides the derivative back as a direct current (DC) control output signal CO to the signal generator 602. This closed loop operates to keep the signal generator transmission output frequency at the peak absorption frequency of the cell gas using lock-in differentiation based on the RX signal received from the cell 508. The REF_CLK signal from the signal generator 602 is the TX signal clock and can be provided to other circuitry such as frequency dividers and other control circuits requiring use of a clock.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A device, comprising:
    an insulative structure having opposite first and second surfaces;
    a first substrate having opposite first and second surfaces, the first surface of the first substrate attached to the second surface of the insulative structure, and the first substrate including a cavity that extends through the first substrate from the first surface of the first substrate to the second surface of the first substrate;
    a second substrate having opposite first and second surfaces, the first surface of the second substrate attached to the second surface of the first substrate and sealing the cavity;
    dipolar molecules within the cavity;
    a metal layer having opposite first and second surfaces, the second surface of the metal layer attached to the first surface of the insulative structure;
    a dielectric layer having opposite first and second surfaces, the second surface of the dielectric layer attached to the first surface of the metal layer; and
    an antenna on the first surface of the dielectric layer, the antenna aligned with the cavity.

2. The device of claim 1, wherein the dielectric layer is a first dielectric layer, and the device further comprises a second dielectric layer having opposite first and second surfaces, the second surface of the second dielectric layer attached to the first surface of the first dielectric layer.

3. The device of claim 2, further comprising an electronic bandgap structure on the first surface of the second dielectric layer.

4. The device of claim 1, wherein the dipolar molecules are water molecules, and the cavity has a pressure of less than 0.015 mbars.

5. The device of claim 1, wherein the metal layer includes an aperture vertically aligned with the cavity.

6. The device of claim 1, wherein the antenna is a first antenna, and the device further comprises an amplifier, a filter, a signal generator, and a second antenna on the first dielectric layer, wherein:
    the signal generator is coupled to the first antenna and is configured to generate a transmit signal to the first antenna;
    the amplifier is coupled to the second antenna and is configured to generate an error signal based on a receive signal from the second antenna and the transmit signal; and
    the filter is coupled to the amplifier and the signal generator, and is configured to: generate a control output signal, based on the error signal, to adjust a frequency of the transmit signal generated by the signal generator.

7. A device, comprising:
    a glass sheet having opposite first and second surfaces;
    a first semiconductor substrate having opposite first and second surfaces, the first surface of the first semiconductor substrate attached to the second surface of the glass sheet, the first semiconductor substrate including a cavity that extends through the first semiconductor substrate from the first surface of the first semiconductor substrate to the second surface of the first semiconductor substrate;
    a second semiconductor substrate having opposite first and second surfaces, the first surface of the second semiconductor substrate attached to the second surface of the first semiconductor substrate and sealing the cavity;
    dipolar molecules within the cavity;
    a metal layer having opposite first and second surfaces, the second surface of the metal layer attached to the first surface of the glass sheet;
    a dielectric layer having opposite first and second surfaces, the second surface of the dielectric layer attached to the first surface of the metal layer;
    first and second antennas on the first surface of the dielectric layer, the first and second antennas aligned with the cavity; and
    a transceiver electrically coupled to the first and second antennas and configured to inject a transmit signal into the cavity through the first antenna, generate an error signal based on the transmit signal and a receive signal from the second antenna, and dynamically adjust a frequency of the transmit signal based on the error signal.

8. The device of claim 7, wherein the dielectric layer is a first dielectric layer, and the device further comprises:
    a second dielectric layer having opposite first and second surfaces, the second surface of the second dielectric layer attached to the first surface of the first dielectric layer; and
    an electronic bandgap structure on the first surface of the second dielectric layer.

9. The device of claim 7, the dipolar molecules are water molecules, and the cavity has a pressure of less than 0.15 mbars.

10. The device of claim 7, wherein the transceiver includes:
    a signal generator coupled to the first antenna and configured to generate the transmit signal; an amplifier coupled to the second antenna and configured to generate the error signal; and a loop filter coupled to the amplifier and the signal generator, the loop filter is configured to, based on the error signal, generate a control output signal to the signal generator.

* * * * *